US006926548B2

(12) United States Patent
Reasoner et al.

(10) Patent No.: US 6,926,548 B2
(45) Date of Patent: Aug. 9, 2005

(54) CIRCUIT CARD

(75) Inventors: Kelly J. Reasoner, Fort Collins, CO (US); David P. Jones, deceased, late of Bellvue, CO (US); by Marie Schaub-Jones, legal representative, Cave Creek, AZ (US); Ronald L. Ehrlich, Greeley, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/678,867

(22) Filed: Oct. 3, 2003

(65) Prior Publication Data

US 2005/0074994 A1    Apr. 7, 2005

(51) Int. Cl.[7] .......................................... H01R 13/629
(52) U.S. Cl. ..................... 439/310; 439/64; 439/376; 361/789
(58) Field of Search ................ 439/310, 376, 439/61, 65, 62, 131, 476.1, 64, 342; 361/789, 361/803

(56) References Cited

U.S. PATENT DOCUMENTS 5,604,662 A    2/1997  Anderson et al.
6,148,352 A *  11/2000 Coale et al. ............... 361/727
6,269,411 B1   7/2001  Reasoner
6,272,573 B1   8/2001  Coale et al.
6,698,937 B2 * 3/2004  Grimes et al. ............ 439/157

OTHER PUBLICATIONS

"Tape Library Twenty Slot to Forty Slot Upgrade Kit," Modular Scalability Guide for Library Models 2/20, 4/40, 6/60, and 6/140, Edition 2, Date: Jun. 2000, Printed in Greele, CO USA.

"Tape Library Twenty Slot to Forty Slot Upgrade Overview Poster" HP, Date:Feb. 29, 2000.

"Tape Library Upgrade and Replacement Instructions," For Models 2/20, 4/40, 6/60, 4/100, 6/100, 6/120, 6/140, 8/140, 10/140, and 12/140, Edition 3, Date: Dec. 2000, Printed in USA.

* cited by examiner

*Primary Examiner*—Renee Luebke
*Assistant Examiner*—Felix O. Figueroa

(57) ABSTRACT

A circuit card is disclosed. In one embodiment, the circuit card comprises a first connector to connect the circuit card to a first mating connector, a second connector movable between first and second positions, to connect the circuit card to a second mating connector, and a mechanism to move the second connector between the first and second positions along a defined path.

19 Claims, 5 Drawing Sheets

CIRCUIT CARD

BACKGROUND OF THE INVENTION

Modular storage devices, such as tape libraries, can be expanded by stacking devices together. One method that has been used to connect two storage devices is to include a circuit card in the second storage device to act as a slave to a control card of the base device. The devices are also connected with a cable that takes up one of the card slots on each of the devices. Thus, at least two card slots in the second device, one for the slave card and one for the cable, are used to connect the base device to the second storage device. Two card slots are also utilized in each additional device added to the configuration. Additionally, the pins on the connectors can become damaged during manual insertion of the cable connecting the devices together.

SUMMARY OF THE INVENTION

In one embodiment, a circuit card with a movable connector is disclosed. The circuit card comprises a first connector to connect the circuit card to a first mating connector. Additionally, the circuit card includes a second connector that is movable between first and second positions. The second connector may be used to connect the circuit card to a second mating connector. The circuit card also includes a mechanism to move the second connector between the first and second positions along a defined path.

BRIEF DESCRIPTION OF THE DRAWINGS

Illustrative embodiments of the invention are illustrated in the drawings in which.

DETAILED DESCRIPTION

Figure 1A:
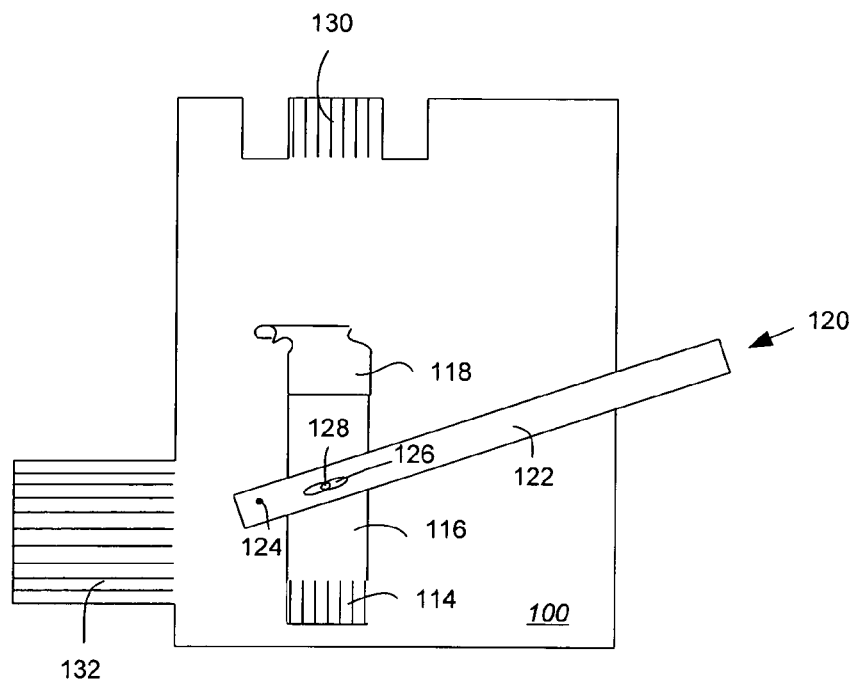
FIG. 1A illustrates a first exemplary embodiment of a circuit card having a second connector in a first position.
Figure 1B:
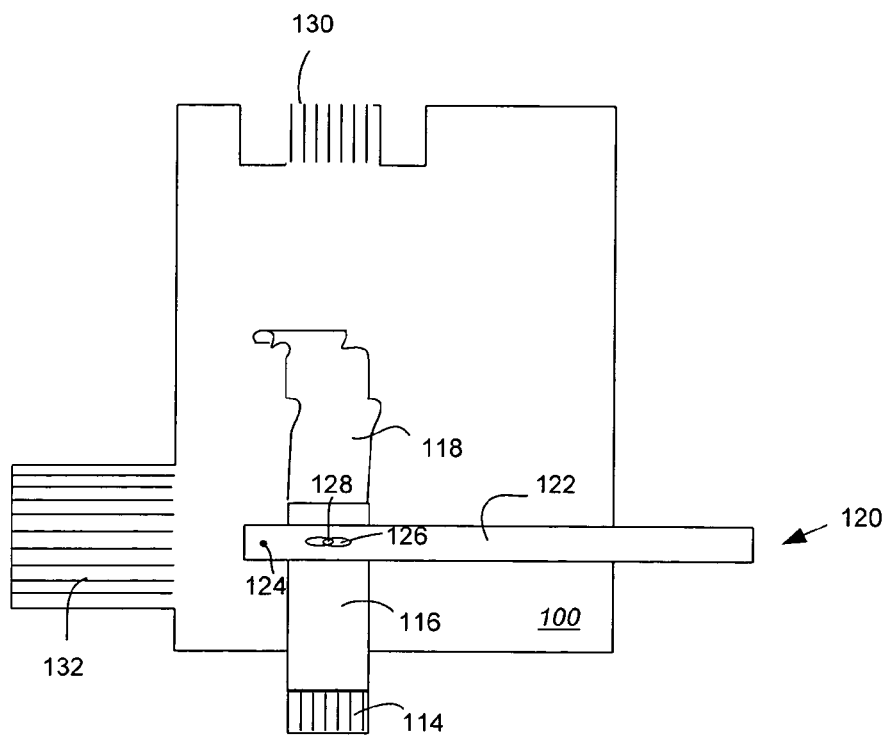
FIG. 1B illustrates the circuit card of FIG. 1A with the second connector in a second position.

An exemplary circuit card with a movable connector is illustrated in FIGS. 1A and 1B. As shown in FIG. 1A, the circuit card 100 includes a first connector 132. The first connector 132 may be used to connect the card 100 to a first mating connector. In one embodiment, the first mating connector may be a backplane of a storage device (e.g., tape library or disk device) or a server. The first connector may be any type of connector appropriate for making the connection to the first mating connector. By way of example, the first connector may be an edge connector, a male connector, or a female connector. It should be appreciated that the type of connector may vary depending upon the configuration in which circuit card 100 is used.

The circuit card 100 further includes a second connector 114. The second connector 114 is movable between first and second positions. FIG. 1A illustrates the second connector 114 in a first position, and FIG. 1B illustrates the second connector 114 in the second position. When in the second position, the second connector 114 may be used to connect the circuit card 100 to a second mating connector. In one embodiment, the second mating connector may be a second circuit card coupled to a second storage device (e.g., tape library or disk device) or server. The second circuit card may be configured similarly or differently from circuit card 100. Although FIGS. 1A and 1B illustrate the second connector 114 moving down along a longitudal axis of the circuit card from the first position to the second position, other paths are also contemplated. For example, second connector 114 may be moved upwards or along a latitudal axis of the circuit card to connect with second mating connector.

Circuit card 100 additionally includes a mechanism 120 to move the second connector 114 between the first and second positions along a defined path. It should be appreciated that the mechanism 120 may be any type of mechanism that can cause the second connector 114 to move from a first position to a second position. The mechanism 120 may be triggered mechanically (e.g., a user moving the mechanism 120 from a first position to a second position) or electrically.

In one embodiment, the mechanism 120 may include a lever mechanism 122 pivotally connected to circuit card 100 with pivot 124. The second connector 114 may be moved between first and second positions by moving the lever mechanism 122 between a first and second position. By way of example, moving the lever mechanism 122 downward from a first position to a second position may cause the second connector 114 to move downward and connect with second mating connector. Other configurations between mechanism 120, second connector 114, and circuit card 100 are also contemplated. For example, a button, switch, or sliding mechanism could be used to mechanically move or actuate the second connector 114 between the first and second positions.

Mechanism 120 may further include a movable rigid material 116 coupled to second connector 114. Movable rigid material 116 may be a printed circuit board and may include circuitry that connects with circuitry on circuit card 100. Lever mechanism 120 is coupled to the rigid material with a pin 128 inserted into a channel 126 of the lever mechanism 120. In one embodiment, movable rigid material 116 may be coupled between second connector 114 and circuitry on the circuit card 100 by a flexible connector 118 such as a ribbon cable. It should be appreciated that other configurations may also be used to connect second connector 114 with circuitry on the circuit card 100. By way of example, second connector 114 may be directly connected to the circuit card with a flexible connector, such as a ribbon cable.

In some embodiments, circuit card 100 may be used to connect to a third mating connector. Thus, circuit card 100 may optionally include a third connector 130 to connect the circuit card 100 to a third mating connector. In one embodiment, the third mating connector may be a third circuit card connected to a third storage device. The third storage device may be vertically stacked on a second storage device that is coupled to circuit card 100 via first connector 132. One or more additional storage devices may be stacked on top of third storage device in a similar configuration as that between second and third storage devices. To facilitate multiple device stacking, third connector 130 may share a common axis with second mating connector 114. Other configurations between second connector 114 and third connector 130 are also contemplated.

It should be appreciated that by using a circuit card 100 to connect two devices, only one card slot is required for the connection as the circuit card 100 may provide both a mechanical and electrical connection between the two devices. Additionally, by using mechanism 120 to move the second connector 114 along a defined path, the pins of the connectors may be less likely to become damaged than if a manual connection process is used to connect connector 114 to second mating connector.

Figure 2:
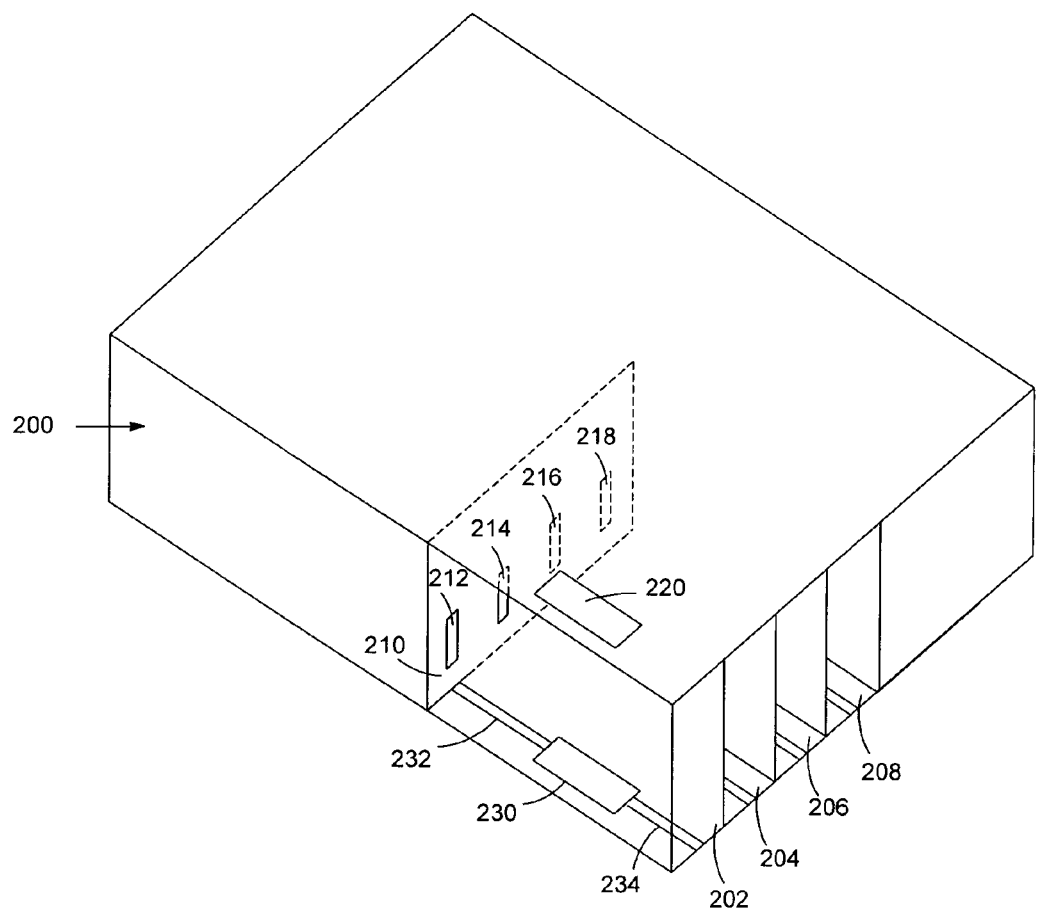
FIG. 2 illustrates a perspective of a storage device housing that may be used to hold the circuit card of FIGS. 1A and 1B.

FIG. 2 illustrates an exemplary configuration in which circuit card 100 may be used. FIG. 2 illustrates a housing 200, such as a storage device housing. The housing 200 may include one or more slots 202-208 to receive circuit cards. A variety of different types of devices, such as storage devices (tape libraries, disk devices) or servers, may be inserted into storage device housing. The backplane 210 of a device inserted into storage device housing 200 may include a plurality of mating connectors 212–218 aligned with card slots 202–208.

Housing 200 may further include card positioning rails 232, 234. Card positioning rails may be positioned on either or both the top and bottom of one or more card slots 202–208. The card positioning rails may be used to correctly align cards inserted into card slots 202–208 with the backplane connectors 212–218.

Additionally, housing 200 includes a slot 220 vertically aligned with a slot 230. Slot 230 may allow a movable connector 114 on a circuit card 100 to move downward to mate with a second circuit card inserted into a second housing stacked below housing 200. In one embodiment, the second housing may be configured similar to housing 200 and a slot similar to slot 220 allows the second mating connector 114 to pass through the second storage device housing to mate with a connector on the second circuit card. Similarly, slot 220 may be used to allow a movable connector from a third circuit card inserted into a third storage housing stacked above housing 200 to pass through storage device housing to mate with a connector 130 of a circuit card inserted into card slot 202.

It should be appreciated that configurations other than that depicted in FIG. 2 are also contemplated. By way of example, slots 220/230 may be horizontally aligned. Additionally, slots 220/230 may be positioned over any of the card slots 202–208.

Figure 3:
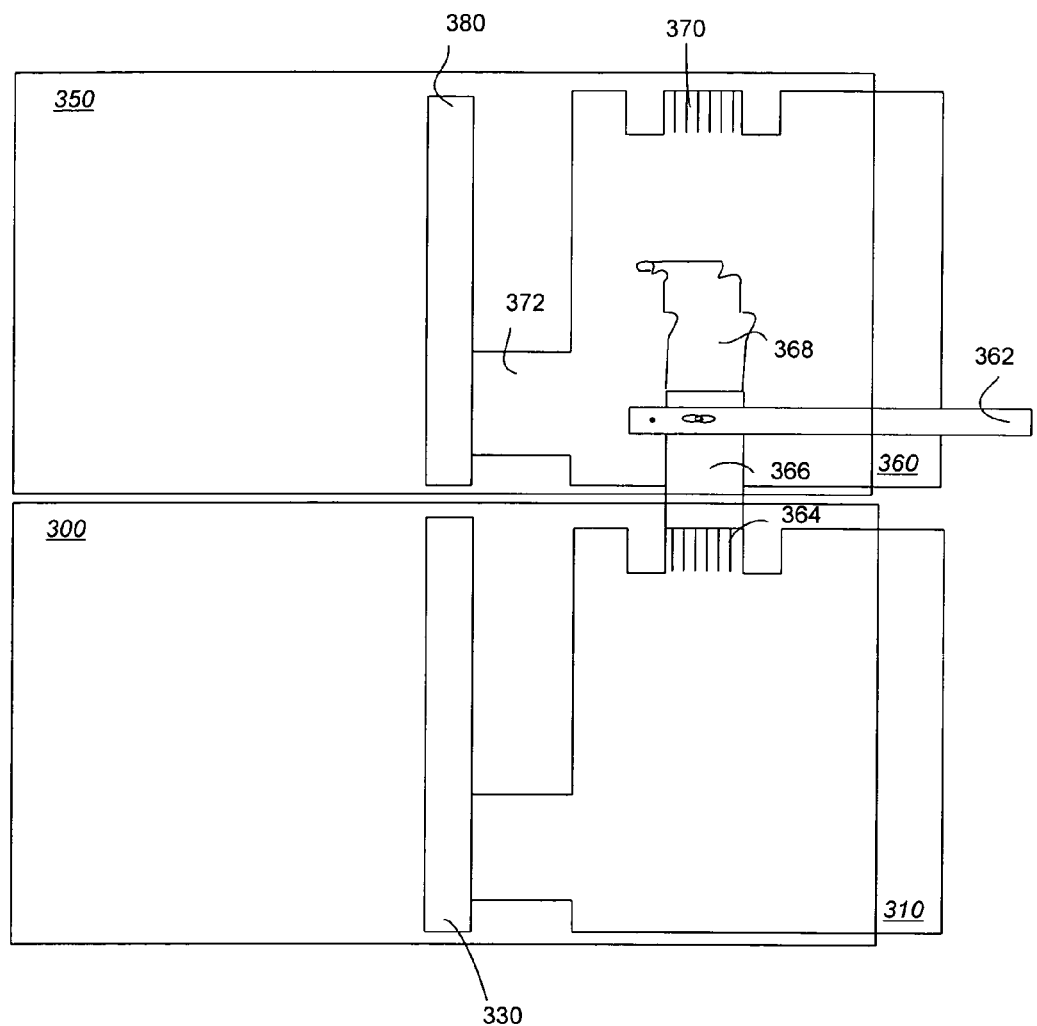
FIG. 3 illustrates a side view of a first device coupled to a second device with a circuit card such as that shown in FIGS. 1A and 1B.
Figure 4:
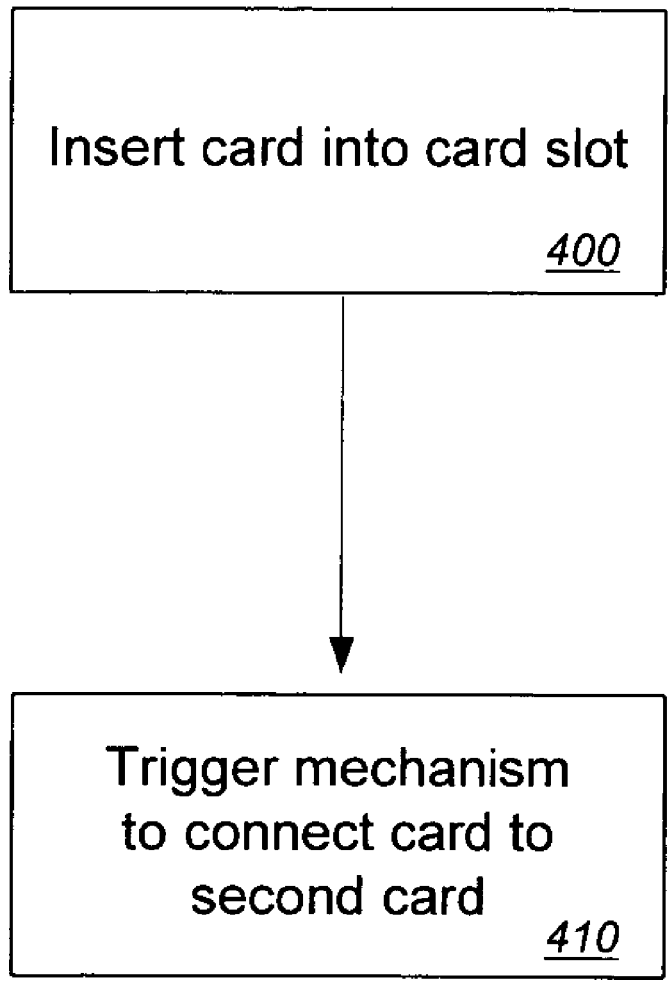
FIG. 4 illustrates a method of coupling circuit cards together.

FIG. 3 illustrates a device 350 (e.g., storage device or server) vertically stacked on a device 300. As illustrated by FIG. 4, the devices 300, 350 may be connected by inserting a circuit card 360 into a slot of a housing holding storage device 350. Inserting circuit card 360 may cause a first connector 372 of the circuit card to connect with a mating connector on a backplane 380 of device 350.

Next, a mechanism 362 is triggered 410 to connect circuit card 360 to circuit card 310. Circuit card 310 is coupled to backplane 330 of device 300. By way of example, circuit card 310 may be a control card, such as a library control card, and circuit card 360 may be a slave card. In one embodiment, the mechanism triggered to connect circuit cards 310, 360 may include a lever mechanism that moves a movable connector 364 from a first position to a second position along a defined path, causing the movable connector 364 to mate with a mating connector on circuit card 310. The mechanism may further include a printed circuit board 366 that connects circuitry on the circuit card 310 to circuitry on circuit card 360 via ribbon cable 368. The devices 300, 350 may be disconnected by moving the lever mechanism from the second position back to the first position causing the movable connector 364 to become disconnected from circuit card 310.

Figure 5:
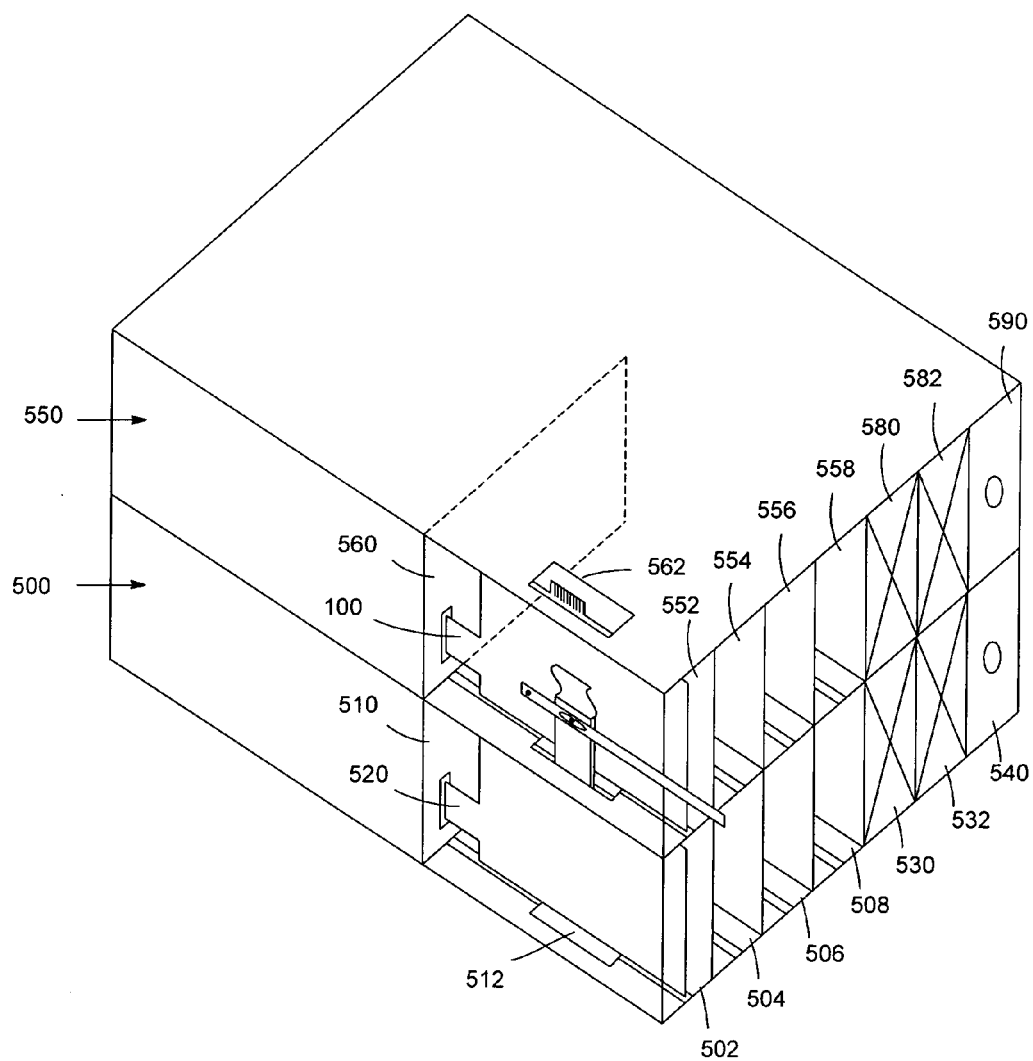
FIG. 5 illustrates a perspective view of a first tape library coupled to a second tape library using a circuit card such as that shown in FIGS. 1A and 1B.

FIG. 5 illustrates an exemplary embodiment of two tape libraries 500, 550 coupled together. Tape library 500 includes tape drives 530, 532 and power supply 540. The housing of tape library 500 includes a plurality of card slots 502–508. Inserted into one of the slots is a circuit card 520, such as a library control card or a slave card. Circuit card 520 is connected to the backplane 510 of tape library 500.

Tape library 550 includes tape drives 580, 582 and power supply 590. The housing of tape library 550 includes a plurality of card slots 552–558. Inserted into one of the card slots 552 is a circuit card 100, such as that described with reference to FIGS. 1A and 1B. Circuit card 100 is coupled to a backplane 560 of tape library 550. As described elsewhere in this application, mechanism 120 has been triggered to cause circuit card 100 to become coupled to circuit card 520. In one embodiment, circuit card 100 may act as a slave card to circuit card 520.

Each tape library 500, 550 housing includes a slot to allow movable connector 114 to pass through the housing. Additionally, housing of tape library 500 includes a bottom slot 512 and housing of tape library 562 includes a top slot sharing a common axis with movable connector 114. These slots 512, 562 may allow additional libraries to be added to the configuration. It should be appreciated that alternate embodiments may not include slots 512, 562.

What is claimed is:

1. A circuit card comprising:
   a first connector to connect the circuit card to a first mating connector;
   a second connector, movable between first and second positions, to connect the circuit card to a second mating connector;
   a printed circuit board, extending from and electrically coupled to the second connector;
   a flexible connector, electrically coupled between the printed circuit board and the circuit card; and
   a lever mechanism, pivotally coupled to the circuit card, and also coupled to the printed circuit board, to move the second connector between its first and second positions along a defined path.

2. The circuit card of claim 1, wherein the first connector is configured to connect to a first storage device.

3. The circuit card of claim 2, wherein the second connector is configured to connect to a second circuit card coupled to a second storage device.

4. The circuit card of claim 3, further comprising a third connector sharing a common axis with the second position of the second connector, the third connector to connect the circuit card to a third circuit card coupled to a third storage device.

5. The circuit card of claim 1, wherein the first connector is configured to connect to a tape library.

6. The circuit card of claim 1, wherein the first connector is configured to connect to a disk device.

7. The circuit card of claim 1, wherein the flexible connector comprises a ribbon cable.

8. A method comprising:
   inserting a first circuit card into a card slot of a first housing; and
   connecting the first circuit card to a second circuit card in a second housing by triggering a mechanism on the first circuit card, the mechanism being triggered by moving a lever mechanism between first and second positions to thereby cause a printed circuit board with an electrically attached connector to move between first and second positions, wherein movement of the printed circuit board causes its attached connector to become electrically coupled to the second circuit card.

9. The method of claim 8, wherein the first housing comprises a storage device housing.

10. The method of claim 9, wherein inserting a first circuit card comprises connecting the first circuit card to a backplane of a first storage device in the first storage device housing.

11. The method of claim 10, wherein the first storage device comprises a tape library.

12. The method of claim 10, wherein the first storage device comprises a disk device.

13. A system comprising:
   a first storage device housing including a first card slot;
   a first storage device inserted into the first storage device housing;
   a first circuit card inserted into the first card slot, the first circuit card connected to a backplane of the first storage device;
   a second storage device housing vertically stacked on the first storage device housing, the second storage device housing including a second card slot;
   a second storage device inserted into the second storage device housing; and
   a second circuit card inserted into the second card slot, the second circuit card including:
      a first connector to connect the circuit card to a backplane of the second storage device;
      a second connector, movable between first and second positions, when in the second position to connect the second circuit card to the first circuit card; and
      a mechanism to move the second connector between the first and second positions.

14. The system of claim 13, wherein the mechanism includes a lever mechanism pivotally coupled to the circuit card.

15. The system of claim 14, wherein the mechanism further includes a printed circuit board coupled to the second connector and the lever mechanism.

16. The system of claim 13, wherein the first storage device and the second storage device comprise tape libraries.

17. The system of claim 13, wherein the first storage device and the second storage device comprise disk devices.

18. The system of claim 13, wherein the first storage device housing further includes one or more additional card slots.

19. A system comprising:
   a first storage device housing including a first card slot;
   a first storage device inserted into the first storage device housing; and
   a first circuit card inserted into the first card slot, the first circuit card including:
      a first connector to connect the first circuit card to a backplane of the first storage device;
      a second connector, movable between first and second positions, when in the second position to connect the first circuit card to a second circuit card; and
      a mechanism to move the second connector between the first and second positions.

* * * * *